United States Patent [19]

Cordts

[11] Patent Number: 4,714,641

[45] Date of Patent: Dec. 22, 1987

[54] FERROMAGNETIC FILMS FOR HIGH DENSITY RECORDING AND METHODS OF PRODUCTION

[75] Inventor: Bernhard F. Cordts, Topsfield, Mass.

[73] Assignee: Varian Associates, Inc., Palo Alto, Calif.

[21] Appl. No.: 707,995

[22] Filed: Mar. 4, 1985

Related U.S. Application Data

[62] Division of Ser. No. 561,692, Dec. 15, 1983, Pat. No. 4,520,040.

[51] Int. Cl.$^4$ .............................................. B22D 25/00
[52] U.S. Cl. ................................... 428/610; 428/611; 428/614; 428/547; 428/552; 428/558; 428/676; 428/686; 428/928
[58] Field of Search ............... 428/607, 611, 928, 676, 428/686, 547, 552, 558, 610, 614

[56] References Cited

U.S. PATENT DOCUMENTS

| | | | |
|---|---|---|---|
| 3,202,530 | 8/1965 | Wolfe et al. | 428/611 |
| 3,525,635 | 8/1970 | Haller | 428/678 |
| 4,372,985 | 2/1983 | Bailey | 427/38 |
| 4,390,601 | 6/1983 | Ono et al. | 204/192 N |
| 4,395,465 | 7/1983 | Takagi et al. | 428/626 |
| 4,404,233 | 9/1983 | Ikeda et al. | 427/35 |
| 4,410,583 | 10/1983 | Hanaoka | 428/611 |

OTHER PUBLICATIONS

K. T. Short et al., "High Resolution RBS and Channeling Analysis of Ion Implanted Single Crystal Fe", *Nucl. Instrum. Methods,* 191 (1981), pp. 537–542.

D. M. Follstaedt, "Microstructure Evolution in Titanium-Implanted Iron," *Thin Solid Films,* 63 (1979), p. 39.

*Handbook of Physics,* Ed. E. Condon et al., 2nd Ed., McGraw-Hill, Part 4, Chap. 8, Sec. 9, pp. 4–139 to 4–141.

*Primary Examiner*—John P. Sheehan
*Attorney, Agent, or Firm*—Stanley Z. Cole; Gerald M. Fisher; Terrence E. Dooher

[57] ABSTRACT

A ferromagnetic film for magnetic recording comprises a copper substrate having particles of iron and iron oxides dispersed in the surface layer of the copper. The particles have maximum dimensions in the range between 50 and 500 Angstroms. The ferromagnetic film can be formed by ion implantation of iron ions into the copper substrate followed by heat treatment to permit growth of ferromagnetic particles to the desired size. As an alternative to ion implantation, the iron can be deposited on the copper substrate by sputtering or evaporation and mixed with the copper by ion beam mixing.

4 Claims, No Drawings

FERROMAGNETIC FILMS FOR HIGH DENSITY RECORDING AND METHODS OF PRODUCTION

This application is a division, of application Ser. No. 561,692, filed Dec. 15, 1983.

BACKGROUND OF THE INVENTION

This invention relates to ferromagnetic films and, more particularly, to ferromagnetic films having extremely small ferromagnetic particle size and to methods for production of said films.

Ferromagnetic films provide an excellent medium for recording of video, audio and digital information. Magnetic tapes and disks are widely used in the computer industry. Some computer users, such as Government agencies and insurance companies, require storage of huge amounts of data. To minimize the volume of the media for storing such quantities of data, high recording density is required. In the personal computer industry, the need exists for low cost, high density recording media.

Present day magnetic recording media utilize iron oxide particles dispersed in a polymer substrate. The iron oxide is in the form of needles 1 to 2 micrometers in length and is manufactured by a chemical process. The iron oxide is imbedded in the substrate by flowing the polymer over the surface and mixing in the particles. According to a newly developed technique, the iron oxide needles are arranged vertically in the substrate in order to increase recording density. However, this technique is not compatible with existing recording equipment. It has not been possible to produce iron oxide particles smaller than the 1 to 2 micrometer needles described above, due to limitations in the manufacturing process.

It is an object of the present invention to provide novel ferromagnetic films.

It is another object of the present invention to provide novel methods for production of ferromagnetic films.

It is yet another object of the present invention to provide novel ferromagnetic films for high density magnetic recording and methods of production thereof.

It is still another object of the present invention to provide methods of production of ferromagnetic films which achieve a high degree of uniformity and control of parameters.

SUMMARY OF THE INVENTION

According to the present invention, these and other objects and advantages are achieved in a ferromagnetic film comprising a substrate material having low solubility for a selected ferromagnetic material and a plurality of particles of the selected ferromagnetic material dispersed in the surface layer of the substrate. The particles have a maximum dimension in the range between 50 and 500 Angstroms. A preferred ferromagnetic film includes particles of iron and oxides of iron dispersed in a copper substrate.

According to another aspect of the present invention, there is provided a method for fabricating a ferromagnetic film. The method includes the steps of providing a substrate of a material having low solubility for a selected ferromagnetic material and implanting ions of the selected ferromagnetic material into a surface layer of the substrate. The substrate is then heated to permit growth of the particles of the ferromagnetic material to the desired particle size. Typically, the particles are permitted to grow to a maximum dimension between 50 and 500 Angstroms when the substrate is copper and iron ions are implanted therein.

According to yet another aspect of the present invention, there is provided a method for fabricating a ferromagnetic film comprising the steps of providing a substrate of a material having low solubility for a selected ferromagnetic material and depositing a thin layer of the selected ferromagnetic material on the surface of the substrate. The layer of ferromagnetic material is irradiated with an ion beam of an inert material so as to cause ion beam mixing of the ferromagnetic material into a surface layer of the substrate. The substrate is heated to permit growth of particles of the ferromagnetic material to a desired particle size. The ferromagnetic material can be deposited by sputtering or evaporation.

DETAILED DESCRIPTION OF THE INVENTION

The present invention provides a ferromagnetic film incorporating extremely small ferromagnetic particles which provide the capability for high recording density. As noted hereinabove, the ferromagnetic particles currently utilized in magnetic recording media are needle-shaped particles of iron oxide ($\gamma$—$Fe_2O_3$) having dimensions on the order of 1 to 2 micrometers. Particles of this size can have more than one magnetic domain. Magnetic particles can be characterized by a critical size below which only a single domain can exist. For iron, this critical size is approximately 200 Angstroms. Magnetic particles are also characterized by a second critical size below which behavior is superparamagnetic. That is, the magnetization of the particle can change due to thermal effects when no field is applied, thereby rendering such particles unusable in recording media. For iron, this second critical size is approximately 50 Angstroms. The size at which ferromagnetic particles become superparamagnetic, therefore, sets a lower limit on the size of particles which can be used in magnetic recording media. For maximum recording density, ferromagnetic films should have the smallest particles consistent with the above criteria. According to the prior art chemical processes used for producing ferromagnetic particles, this limit of particle size has not been reached.

The ferromagnetic film, according to the present invention, utilizes ferromagnetic particles having maximum dimensions in the range between 50 and 500 Angstroms. The ferromagnetic particles are dispersed in the surface layer of a substrate. The substrate material is selected so that the ferromagnetic material has low solubility therein. A preferred ferromagnetic material is iron, since it has the highest magnetic moment per atom of all the elements. Other suitable ferromagnetic materials are nickel and cobalt. A preferred substrate material for use with iron is copper, since iron has a solubility of about 1% in copper. The substrate can be bulk material or can be a layer as thin as 1,000 Angstroms, since the ferromagnetic properties are created in a layer near the surface. To produce a high density of iron particles of 200 Angstroms diameter requires on the order of $2 \times 10^{17}$ atoms/cm$^2$. Methods of fabricating the ferromagnetic film are described in detail hereinafter.

One method of fabricating the ferromagnetic film includes ion implantation of ferromagnetic ions into a substrate. In the example described above, pure iron ions are implanted into the surface layer of copper. As noted above, about 1% of the iron stays in solid solution with the copper. Excess iron forms a second phase particle of pure iron. Free oxygen present in the copper can oxidize the iron to form oxides such as FeO, $Fe_2O_3$ and $Fe_3O_4$. However, this is not a detrimental result, since $Fe_2O_3$ and $Fe_3O_4$ are ferromagnetic materials. Ion energies in the range between 80 KeV and 120 KeV provide 200 to 500 Angstroms range of iron ions in copper. The dose of iron ions is in the range between $5 \times 10^{16}$ ions/cm$^2$ and $5 \times 10^{17}$ ions/cm$^2$. Typically, the dose is about $2 \times 10^{17}$ ions/cm$^2$. The implantation can be performed on commercially available ion implanters such as the Varian/Extrion Division Model DF3000. Ions of the desired species are generated in an ion source. An ion beam from the ion source is mass analyzed and focused by an analyzer magnet and is then accelerated to the desired energy by an accelerator tube. The focused ion beam is deflected over the surface area of the target substrate to produce a uniform distribution of implanted ions. Ion implantation systems are generally known and are not within the scope of the present invention.

Heating of the copper substrate is required to permit growth of the particles of iron and iron oxide to the desired size. Without heat treatment after ion implantation, the ferromagnetic particles can be so small that superparamagnetic properties are exhibited. The particle growth can be predicted from the temperature and duration of the heat treatment. A typical heat treatment is 500° C. for approximately 30 minutes. Alternatively, the substrate can be allowed to increase in temperature during the implant, so that the particles grow as the ions are implanted. However, this is likely to be less uniform and less controlled than a known heat treatment.

In an alternative method for producing the ferromagnetic film, in accordance with the present invention, a thin film of iron is deposited on a substrate of copper. The iron film can be deposited by evaporation or sputtering and should be approximately 200 to 500 Angstroms thick. The copper layer should be at least 1,000 Angstroms thick. As noted above, the copper substrate can be a bulk material or can be a layer of copper adhered to another suitable substrate. A process known as ion beam mixing is then applied to the iron film. An ion beam of an inert material, such as argon, is applied to the iron film. Other suitable beams are xenon and krypton. The ion beam must have sufficient energy to penetrate the iron film and the iron-copper interface and to drive the iron atoms into the underlying copper substrate. The ion beam causes the iron to be mixed into the near surface region of the copper substrate with a result similar to that produced by direct ion implantation of iron. The required ion energy is about 40 KeV for argon and 130 KeV for xenon, while the required dose is in the range between $5 \times 10^{16}$ ions/cm$^2$ and $5 \times 10^{17}$ ions/cm$^2$. Known sputtering techniques can be used to form an iron film while the ion beam mixing can be performed by commercial ion implanters, as noted above. After ion beam mixing, the substrate is heat-treated to form particles, as described hereinabove, in connection with direct ion implantation.

EXAMPLE

Copper foil 0.25 millimeter thick and 0.99999 pure was cut into disk samples about 3 millimeters in diameter. The samples were metallurgically cleaned and polished and were mounted on a holder which clamped the samples at their edges. The holder, which included vertical and horizontal shields to block the ion beam from selected samples, was mounted in a Varian model DF4 ion implanter. The samples were implanted at a variety of doses in the range $1 \times 10^{17}$ ions/cm$^2$ to $4 \times 10^{17}$ ions/cm$^2$ (200 microamps ion beam current, 100 KeV, $5 \times 10^{-6}$ Torr in the implantation chamber). Samples were then heat treated in a vacuum furnace at $1 \times 10^{-6}$ Torr as follows:

Sample A
Dose: $4 \times 10^{17}$ ions/cm$^2$
Anneal: 500° C. for 2 hours
Sample B
Dose: $1 \times 10^{17}$ ions/cm$^2$
Anneal: 390° C. for 70 minutes The samples were examined with a transmission electron microscope and found to have a large amount of precipitates of iron oxides. Electron diffraction ring patterns indicated the presence of FeO, $Fe_2O_3$ and $Fe_3O_4$. Samples which had not been heat treated contained very small crystallites of less than 50 Angstroms. Sample A, which had been treated at 500° C. for two hours, contained precipitates in the range of 50 to 500 Angstroms.

While there has been shown and described what is at present considered the preferred embodiments of the invention, it will be obvious to those skilled in the art that various changes and modifications may be made therein without departing from the scope of the invention as defined by the appended claims.

I claim:

1. A ferromagnetic film comprising:
   a metallic substrate material having low solubility for a selected ferromagnetic material; and
   a plurality of particles of said selected ferromagnetic material in the surface layer of said substrate, said particles having a maximum dimension in the range between 50 and 500 Angstroms.

2. A ferromagnetic film as defined in claim 1 wherein selected ferromagnetic material includes iron and oxides of iron.

3. A ferromagnetic film as defined in claim 2 wherein said substrate comprises copper.

4. A ferromagnetic film as in claim 1 wherein said selected ferromagnetic material includes oxides of iron.

* * * * *